United States Patent
Matsunaga et al.

(10) Patent No.: US 9,456,528 B2
(45) Date of Patent: Sep. 27, 2016

(54) CONNECTING STRUCTURE OF COOLING DEVICE, COOLING DEVICE, AND METHOD FOR CONNECTING COOLING DEVICE

(71) Applicant: NEC Corporation, Tokyo (JP)

(72) Inventors: Arihiro Matsunaga, Tokyo (JP); Minoru Yoshikawa, Tokyo (JP); Hitoshi Sakamoto, Tokyo (JP); Akira Shoujiguchi, Tokyo (JP); Masaki Chiba, Tokyo (JP); Kenichi Inaba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/401,282

(22) PCT Filed: May 10, 2013

(86) PCT No.: PCT/JP2013/003001
§ 371 (c)(1),
(2) Date: Nov. 14, 2014

(87) PCT Pub. No.: WO2013/172004
PCT Pub. Date: Nov. 21, 2013

(65) Prior Publication Data
US 2015/0131229 A1 May 14, 2015

(30) Foreign Application Priority Data
May 16, 2012 (JP) .................. 2012-112498

(51) Int. Cl.
*H05K 7/20* (2006.01)
*B23P 15/26* (2006.01)
(Continued)

(52) U.S. Cl.
CPC ........... *H05K 7/20336* (2013.01); *B23P 15/26* (2013.01); *F28D 15/0266* (2013.01);
(Continued)

(58) Field of Classification Search
CPC ............... H05K 7/20; H05K 7/20336; H05K 7/20318; H05K 7/2039; G06F 1/20; G06F 1/203; H01L 23/40; H01L 23/4338; H01L 23/4093; F28D 15/00; F28D 15/02
USPC .............. 361/679.46–679.49, 688, 689, 692, 361/697, 704–712, 719–724; 165/80.3, 165/80.4, 80.5, 104.33, 121–126, 185; 174/15.2, 16.3; 257/706, 713, 718, 257/719, 723
See application file for complete search history.

(56) References Cited

U.S. PATENT DOCUMENTS 6,442,026 B2 * 8/2002 Yamaoka .................. G06F 1/20
257/719
7,323,358 B1 * 1/2008 Cromwell ........... H01L 23/4093
257/678
(Continued)

FOREIGN PATENT DOCUMENTS

CN 1452787 A 10/2003
JP 2001-119182 4/2001
(Continued)

OTHER PUBLICATIONS

International Search Report and Written Opinion mailed Jul. 16, 2013 in International PCT Application.
(Continued)

*Primary Examiner* — Michail V Datskovskiy
(74) *Attorney, Agent, or Firm* — Finnegan, Henderson, Farabow, Garrett & Dunner LLP

(57) ABSTRACT

It is impossible in a cooling device using a phase-change system, seeking high heat transport performance, to obtain sufficient cooling performance due to the increase in thermal resistance with a heating element to be cooled, therefore, a connecting structure of a cooling device according to an exemplary aspect of the present invention includes a connecting board with an opening; a pressing plate of thin plate elastically deformable; first fixing means for fixing the pressing plate to the connecting board with the pressing plate disposed covering heat receiving means composing the cooling device; and second fixing means for fixing the connecting board to a substrate with the heat receiving means abutting against a heating element mounted on the substrate and disposed in the opening.

14 Claims, 6 Drawing Sheets

(51) Int. Cl.

| | | |
|---|---|---|
| *H01L 23/427* | (2006.01) | |
| *F28D 15/02* | (2006.01) | |
| *G06F 1/20* | (2006.01) | |
| *H01L 23/40* | (2006.01) | |

(52) U.S. Cl.
CPC ......... *F28D15/0275* (2013.01); *H01L 23/427* (2013.01); *H05K 7/2039* (2013.01); *H05K 7/20309* (2013.01); *H05K 7/20318* (2013.01); *F28F 2275/08* (2013.01); *H01L 23/4006* (2013.01); *H01L 2023/4062* (2013.01); *H01L 2924/0002* (2013.01); *Y10T 29/4913* (2015.01); *Y10T 29/53174* (2015.01)

(56) References Cited

U.S. PATENT DOCUMENTS

| | | | | |
|---|---|---|---|---|
| 7,714,423 | B2* | 5/2010 | Reid | H05K 1/021 257/685 |
| 8,303,332 | B2* | 11/2012 | Wertz | H01R 12/73 439/485 |
| 8,437,138 | B2* | 5/2013 | Wertz | H01L 23/4338 361/720 |
| 2003/0058624 | A1* | 3/2003 | Deeney | H05K 7/1061 361/736 |
| 2004/0252462 | A1* | 12/2004 | Cromwell | H01L 23/4093 361/719 |
| 2006/0077637 | A1 | 4/2006 | Ishikawa | |
| 2007/0211445 | A1* | 9/2007 | Robinson | H01L 23/552 361/818 |
| 2009/0101318 | A1* | 4/2009 | Ma | H01L 23/4006 165/104.33 |
| 2011/0048676 | A1 | 3/2011 | Toyoda et al. | |
| 2011/0114294 | A1* | 5/2011 | Degner | H01L 23/4006 165/104.26 |
| 2011/0170265 | A1 | 7/2011 | Lai et al. | |
| 2012/0160449 | A1* | 6/2012 | Fowler | H05K 7/20509 165/80.2 |

FOREIGN PATENT DOCUMENTS

| | | |
|---|---|---|
| JP | 2006-108166 | 4/2006 |
| JP | 2006-125718 | 5/2006 |
| JP | 2007-165685 | 6/2007 |
| JP | 2008-227023 | 9/2008 |
| JP | 2009-130224 | 6/2009 |
| JP | 2011-47616 | 3/2011 |
| JP | 2011-106793 | 6/2011 |

OTHER PUBLICATIONS

Korean Office Action mailed Nov. 18, 2015 by the Korean Patent Office in counterpart Korean Patent Application 10-2014-7031727.
Chinese Office Action mailed Jul. 26, 2016, by the Chinese Patent Office in counterpart Chinese Patent Application 201380025522.0.

* cited by examiner

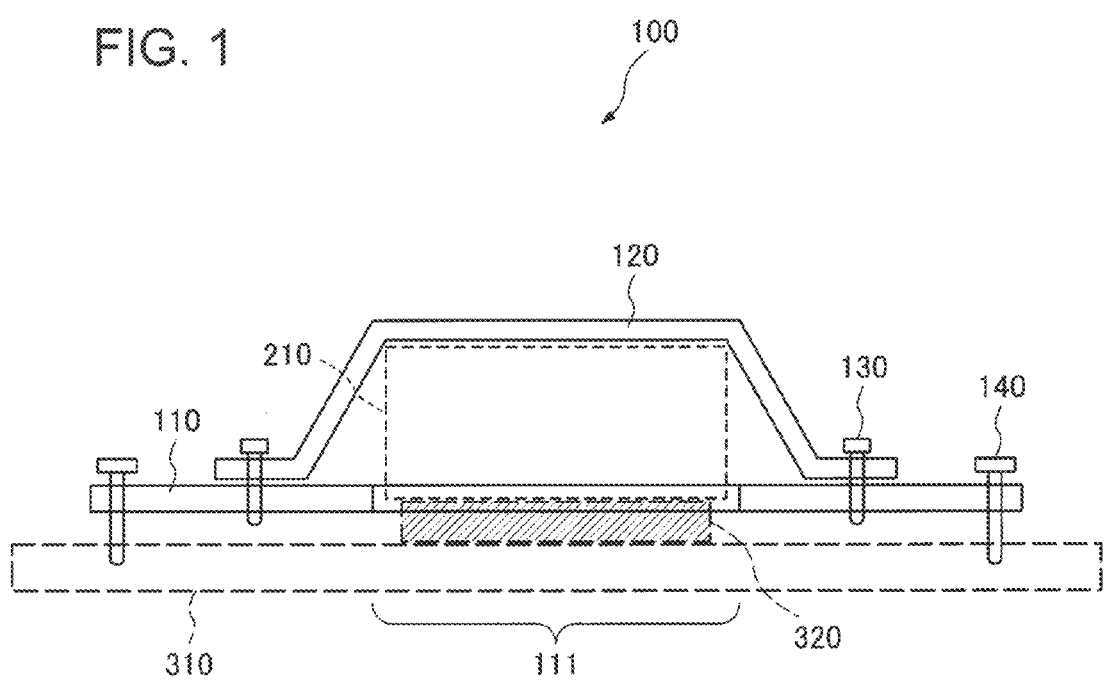

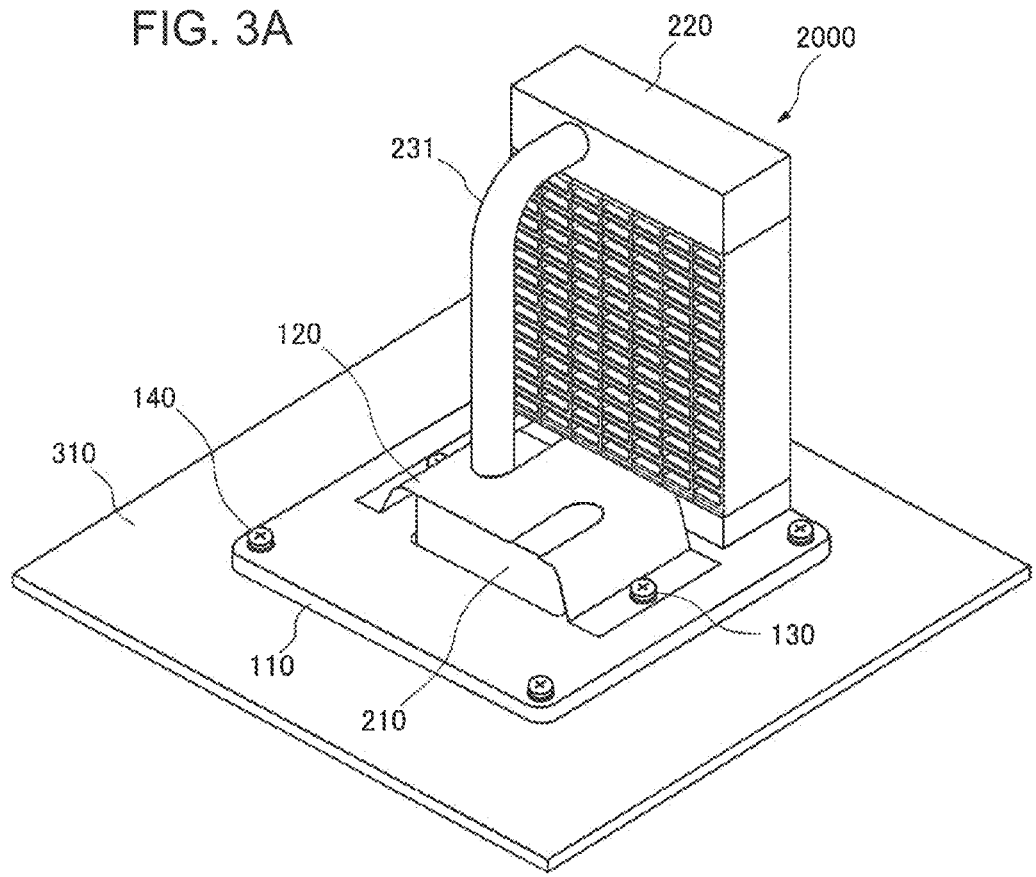

CONNECTING STRUCTURE OF COOLING DEVICE, COOLING DEVICE, AND METHOD FOR CONNECTING COOLING DEVICE

CROSS-REFERENCE TO RELATED PATENT APPLICATIONS

This application is a National Stage Entry of International Application No. PCT/JP2013/003001, filed May 10, 2013, which claims priority from Japanese Patent Application No. 2012-112498, filed May 16, 2012. The entire contents of the above-referenced applications are expressly incorporated herein by reference.

TECHNICAL FIELD

The present invention relates to connecting structures for connecting cooling devices to semiconductor devices, electronic devices, and the like, in particular, to a connecting structure of a cooling device, a cooling device, and a method for connecting a cooling device using a phase-change cooling system in which the heat transportation and heat radiation are performed by a phase-change cycle of vaporization and condensation of a refrigerant.

BACKGROUND ART

In recent days, with the progress of high performance and high functionality in semiconductor devices and electronic devices, the amount of heat generation from them has been increasing. Therefore, a cooling device with high heat transportation capability has been required. The cooling device using a phase-change cooling system in which the heat transportation and heat radiation are performed by a phase-change cycle of vaporization and condensation of a refrigerant makes it possible to improve the heat transportation capability compared to a heat sink and the like. The cooling device is therefore expected as a cooling device for the semiconductor device and the electronic device with a large amount of heat generation.

An example of the cooling device using the phase-change cooling system (hereinafter, also referred to as "a phase-change cooling device") is described in Patent Literature 1. The related phase-change cooling device described in Patent Literature 1 is used in order to cool a semiconductor device as a heat generation source such as a CPU (central processing unit) mounted on a circuit board. The related phase-change cooling device includes an evaporating unit attached on the surface of a semiconductor device and a condenser having a radiator, and between those are attached a pair of conduits composed of a vapor tube and a liquid return tube. The related phase-change cooling device is made to keep its inside to be a reduced (low) pressure condition of approximately one-tenth of the atmospheric pressure, and configures a thermosiphon which can circulate a refrigerant without external motive force such as an electro-motive pump due to the phase change of the water of a liquid refrigerant.

In the related phase-change cooling device, the heat generated in the semiconductor device of a heat generation source is transferred to the evaporating unit. As a result, in the evaporating unit, the water of the liquid refrigerant is boiled and evaporated under the reduced pressure due to the transferred heat, and the generated vapor is guided from the evaporating unit into the condenser through the vapor tube. In the condenser, the refrigerant vapor is cooled by an air blown by a cooling fan to become liquid (water), and then it turns back into the evaporating unit again through the liquid return tube due to the gravity.

On the other hand, with electronic devices being miniaturized and made thinner, a connecting structure is required which connects the cooling device to the semiconductor device corresponding to miniaturizing and making thinner. Patent Literature 2 describes an example of the connecting structure of the cooling device to be mounted on the electronic device which can be made thinner.

The related electronic apparatus described in Patent Literature 2 includes in housing, a circuit board, first and second heating elements, first and second sub heat pipes, a main heat pipe, first and second pressing members, a heat sink, and a cooling fan. The first pressing member presses a first portion of the first sub heat pipe to the first heating element and strengthens the thermal connection between the first sub heat pipe and the first heating element. At this time, the first sub heat pipe is pressed to the first heating element by the first pressing member and can be bent following the inclination or the shape of a die of the first heating element. Therefore, the first sub heat pipe is less likely to come into partial contact with the die of the first heating element.

In the related electronic apparatus, the main heat pipe with a relatively large length, a relatively large thickness, and high heat transport performance is arranged at a position offset from the heating element, and the sub heat pipe is provided between the main heat pipe and the heating element. That is to say, in the related electronic apparatus, the plate-shaped sub heat pipe with a small thickness is overlapped on the circuit board and the heating element, and the main heat pipe with a relatively large thickness is arranged in a region where it does not overlap with the heating element. It is said that the configuration makes it possible to reduce the overall thickness of a heat radiating structure and thus reduce the thickness of the electronic apparatus.

CITATION LIST

Patent Literature

[PTL1]
Japanese Patent Application Laid-Open No. 2011-047616 (paragraphs
to [0049], FIG. 1)
[PTL 2]
Japanese Patent Application Laid-Open No. 2011-106793 (paragraphs
to [0079], FIGS. 2 to 5)

SUMMARY OF INVENTION

Technical Problem

In the electronic apparatus described in Patent Literature 2, the sub heat pipe is formed with a small thickness so that the sub heat pipe may be flexibly deformed according to the inclination of the die or the shape of the surface of the heating element when the sub heat pipe is closely adhered to the heating element. However, since high heat transport performance cannot be obtained using the thinned heat pipe, there has been a problem that the cooling performance of the electronic device decreases.

On the other hand, in the related phase-change cooling device described in Patent Literature ,the high heat transport performance can be obtained compared to the heat pipe because the refrigerant moves as a gas-liquid two-phase flow. The evaporating unit of the related phase-change cooling device is configured to be in the form of a firm box using a metal such as copper superior in thermal conductivity in order to store a sufficient amount of refrigerant and prevent the deformation due to the increase in the internal pressure of a vapor-state refrigerant. Since an evaporating unit like this does not have mechanical flexibility, a partial contact or unequal loading arises between the evaporating unit and the heating element due to variation in shapes of the evaporating unit and the heating element. Therefore, there has been a problem that it is impossible to obtain sufficient cooling performance due to the increase in thermal resistance at the interface between the evaporating unit and the heating element.

Thus, the related cooling device, seeking high heat transport performance, has a problem that it is impossible to obtain sufficient cooling performance due to the increase in thermal resistance with a heating element to be cooled.

The object of the present inventions is to provide a connecting structure of a cooling device, a cooling device, and a method for connecting a cooling device that solve the problem mentioned above that it is impossible in a cooling device using a phase-change system, seeking high heat transport performance, to obtain sufficient cooling performance due to the increase in thermal resistance with a heating element to be cooled.

Solution to Problem

A connecting structure of a cooling device according to an exemplary aspect of the present invention includes a connecting board with an opening; a pressing plate of thin plate elastically deformable; first fixing means for fixing the pressing plate to the connecting board with the pressing plate disposed covering heat receiving means composing the cooling device; and second fixing means for fixing the connecting board to a substrate with the heat receiving means abutting against a heating element mounted on the substrate and disposed in the opening.

A cooling device according to an exemplary aspect of the present invention includes heat receiving means for storing a refrigerant and receiving the heat from a heating element; a connecting board with an opening; a pressing plate of thin plate elastically deformable; first fixing means for fixing the pressing plate to the connecting board with the pressing plate disposed covering the heat receiving means; and second fixing means for fixing the connecting board to a substrate with the heat receiving means abutting against a heating element mounted on the substrate and disposed in the opening.

An electronic device using a cooling device according to an exemplary aspect of the present invention includes a substrate; a heating element mounted on the substrate; heat receiving means for storing a refrigerant and receiving the heat from the heating element; a connecting board with an opening; a pressing plate of thin plate elastically deformable; first fixing means for fixing the pressing plate to the connecting board with the pressing plate disposed covering the heat receiving means; second fixing means for fixing the connecting board to the substrate with the heating element and the heat receiving means disposed in the opening; heat radiating means for radiating heat by condensing and liquefying a vapor-state refrigerant vaporized in the heat receiving means; and a pipe connecting the heat radiating means to the heat receiving means, wherein the first fixing means fixes the pressing plate to the connecting board with the heat receiving means abutting firmly against the heating element, and the second fixing means fixes the connecting board to the substrate with the heat receiving means abutting firmly against the heating element.

A method for connecting a cooling device according to an exemplary aspect of the present invention includes forming a connecting board with an opening; disposing a heat receiving unit that composing a cooling device in the opening; disposing a pressing plate of thin plate elastically deformable so as to cover the heat receiving unit; connecting the pressing plate to the connecting board; and disposing the connecting board on a substrate on which a heating element is mounted so that the heating element may be housed in the opening.

Advantageous Effects of Invention

According to the connecting structure of a cooling device of the present invention, it is possible in a cooling device using a phase-change system to obtain sufficient cooling performance even when configured to obtain high heat transport performance.

BRIEF DESCRIPTION OF DRAWINGS

FIG. 1 is a cross-sectional view illustrating a connecting structure of a cooling device in accordance with the first exemplary embodiment of the present invention.

FIG. 3A is a perspective view illustrating a configuration of an electronic device using a cooling device in accordance with the third exemplary embodiment of the present invention.

DESCRIPTION OF EMBODIMENTS

Figure 2A:
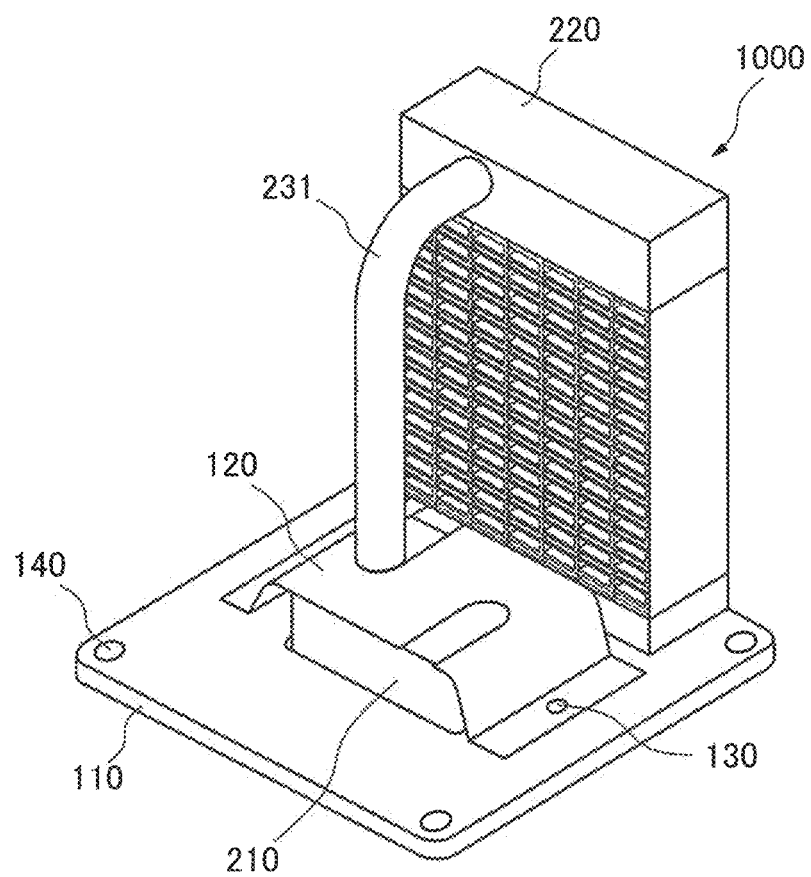
FIG. 2A is a perspective view illustrating a configuration of a cooling device in accordance with the second exemplary embodiment of the present invention.

The exemplary embodiments of the present invention will be described with reference to drawings below.

[The First Exemplary Embodiment]

FIG. 1 is a cross-sectional view illustrating a connecting structure of a cooling device 100 in accordance with the first exemplary embodiment of the present invention. The connecting structure of the cooling device 100 includes a connecting board 110 with an opening 111, a pressing plate 120 of thin plate elastically deformable, a first fixing unit 130, and a second fixing unit 140. The first fixing unit 130 fixes the pressing plate 120 to the connecting board 110 with the pressing plate 120 disposed covering a heat receiving unit 210 composing the cooling device. The second fixing unit 140 fixes the connecting board 110 to a substrate 310 with the heat receiving unit 210 abutting against a heating element 320 mounted on the substrate 310 and disposed in the opening 111.

Part of the pressing plate 120 elastically deforms as a plate spring due to the action of the first fixing unit 130. This makes the variation in shape of the heat receiving unit 210 absorbed. At this time, the second fixing unit 140 fixes the heat receiving unit 210 to the heating element 320 with abutting against each other, which makes it possible to press the whole contact surface between the heating element 320 and the heat receiving unit 210 by equal force. According to the connecting structure of the cooling device 100 of the present exemplary embodiment, it is unnecessary for the heat receiving unit 210 to have the mechanical flexibility in order to be attached firmly to the heating element, unlike in the case of the related electronic device described in Patent Literature 2. That is to say, it becomes possible to use a heat receiving unit having a robust container as the heat receiving unit 210. It is therefore possible to use the connecting structure of the cooling device 100 of the present exemplary embodiment for a phase-change cooling device which can obtain high heat transport performance.

The pressing plate 120 can be configured to include a cutout section where a portion of it is cut away. This makes it possible to adjust the elastic deformation amount in a situation where the pressing plate 120 covers the heat receiving unit 210. The second fixing unit 140 can be configured to include a fastening section and a spring section. By using a spring, it becomes easier to control the second fixing unit 140 so as to press the whole contact surface between the heating element 320 and the heat receiving unit 210 by equal force.

According to the method for connecting a cooling device of the present exemplary embodiment, first, a connecting board with an opening is formed, and a heat receiving unit composing a cooling device is disposed in the opening. A pressing plate of thin plate elastically deformable is disposed so as to cover the heat receiving unit, and the pressing plate is connected to the connecting board. Next, the connecting board is disposed, on a substrate on which a heating element is mounted, so that the heating element may be housed in the opening. Further, with the heat receiving unit made to abut firmly against the heating element, the pressing plate is fixed to the connecting board, and the connecting board is fixed to the substrate.

According to the connecting structure of a cooling device 100 and the method for connecting a cooling device of the present exemplary embodiment, the above-mentioned configuration makes it possible in a cooling device using a phase-change system to obtain sufficient cooling performance even when configured to obtain high heat transport performance.

[The Second Exemplary Embodiment]

Figure 2B:
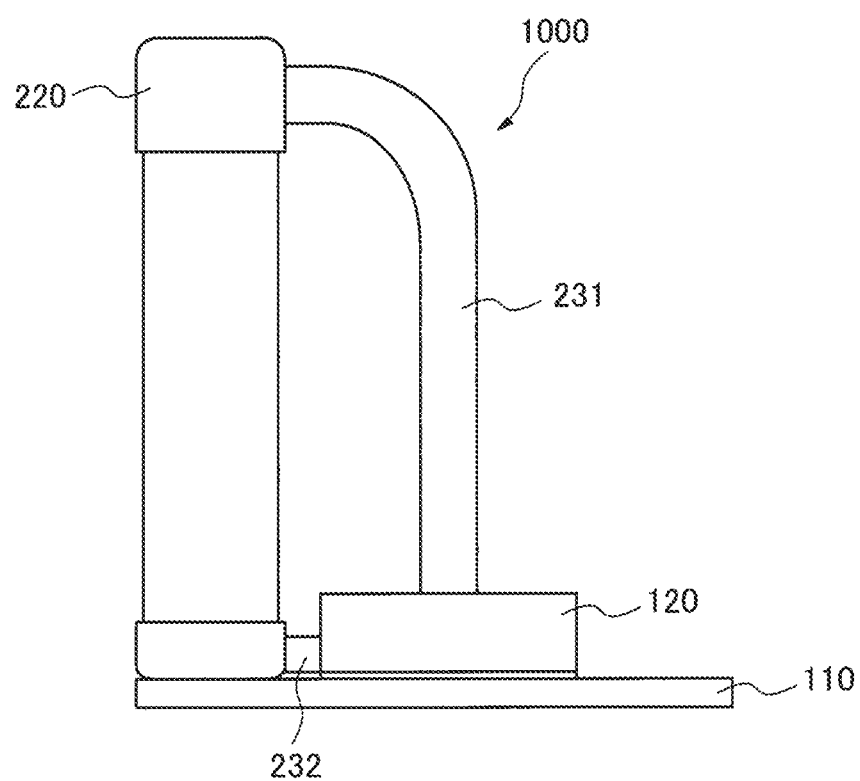
FIG. 2B is a side view illustrating the configuration of the cooling device in accordance with the second exemplary embodiment of the present invention.

Next, the second exemplary embodiment of the present invention will be described. FIG. 2A and FIG. 2B are diagrams illustrating a configuration of a cooling device 1000 in accordance with the second exemplary embodiment of the present invention, FIG. 2A is a perspective view, and FIG. 2B is a side view. The cooling device 1000 includes a heat receiving unit 210 storing a refrigerant and receiving the heat from a heating element, the connecting board 110 with an opening, the pressing plate 120 of thin plate elastically deformable, the first fixing unit 130, and the second fixing unit 140. The first fixing unit 130, as shown in FIG. 1, fixes the pressing plate 120 to the connecting board 110 with the pressing plate 120 disposed covering the heat receiving unit 210. The second fixing unit 140 fixes the connecting board 110 to the substrate 310 with the heat receiving unit 210 abutting against a heating element mounted on the substrate and disposed in the opening.

The cooling device 1000 further includes a heat radiating unit 220 radiating heat by condensing and liquefying a vapor-state refrigerant vaporized in the heat receiving unit 210, and a pipe connecting the heat radiating unit 220 to the heat receiving unit 210. The heat radiating unit 220 can be disposed on the connecting board 110. The pipe includes a first pipe 231 connecting an upper part of the heat receiving unit 210 to an upper part of the heat radiating unit 220, and a second pipe 232 connecting a side surface of the heat receiving unit 210 to a lower part of the heat radiating unit 220.

It is possible in the cooling device 1000 to always keep the inside of the heat receiving unit 210 in the saturated vapor pressure of the refrigerant by using a low-boiling material as a refrigerant and evacuating the heat receiving unit 210 after enclosing the refrigerant in it. It is possible to use as the refrigerant a low-boiling refrigerant such as hydrofluorocarbon and hydrofluoroether, for example, which are insulating and inactive materials. It is possible to use the metal having an excellent thermal conductive property such as aluminum and copper, for example, for the material composing the heat receiving unit 210 and the heat radiating unit 220.

The cooling device 1000 is used with the heating element such as a CPU (central processing unit), for example, disposed on the undersurface of the heat receiving unit 210, and thermally connected to the heat receiving unit 210. The heat from the heating element is transferred to the refrigerant through the heat receiving unit 210, and then the refrigerant vaporizes. At this time, since the refrigerant draws the heat from the heating element as the vaporization heat, a rise in temperature of the heating element is avoided.

The vapor-state refrigerant vaporized in the heat receiving unit 210 flows into the heat radiating unit 220 through the first pipe 231. The vapor-state refrigerant radiates heat in the heat radiating unit 220 and condenses and liquefies. As described above, the cooling device 1000 is configured using the phase-change cooling system in which the heat transportation and heat radiation are performed by a cycle of vaporization and condensation of a refrigerant.

The cooling device 1000 according to the present exemplary embodiment is configured to attach a phase-change type cooler in which the heat receiving unit 210 is connected to the heat radiating unit 220 by the pipes 231 and 232 to the connecting board 110 with the opening. When the pressing plate 120 is connected to the connecting board 110, part of the pressing plate 120 elastically deforms as a plate spring due to the action of the first fixing unit 130. This makes the variation in shape of the heat receiving unit 210 absorbed. At this time, the second fixing unit 140 fixes the heat receiving unit 210 to the heating element with abutting against each other, which makes it possible to press the whole contact surface between the heating element 320 and the heat receiving unit 210 by equal force. Therefore, it is possible to decrease the thermal resistance at an interface between the heat receiving unit 210 and the heating element and to obtain sufficient cooling performance.

According to the method for connecting a cooling device of the present exemplary embodiment, first, the connecting board 110 with an opening is formed, and the heat receiving unit 210 composing a cooling device is disposed in the opening. The heat radiating unit 220, which radiates heat by condensing and liquefying a vapor-state refrigerant vaporized in the heat receiving unit, is disposed on the connecting board 110, and the heat radiating unit 220 is connected to the heat receiving unit 210 by a pipe.

Next, the pressing plate 120 of thin plate elastically deformable is disposed so as to cover the heat receiving unit 210, and the pressing plate 120 is connected to the connecting board 110. And then, the connecting board 110 is disposed, on a substrate on which a heating element is mounted, so that the heating element may be housed in the opening. Further, with the heat receiving unit 210 made to abut firmly against the heating element, the pressing plate 120 is fixed to the connecting board 110, and the connecting board 110 is fixed to the substrate.

According to the cooling device 1000 and the method for connecting a cooling device of the present exemplary embodiment, the above-mentioned configuration makes it possible in a cooling device using a phase-change system to obtain sufficient cooling performance even when configured to obtain high heat transport performance.

Next, the cooling device 1000 according to the present exemplary embodiment will be described in more detail.

The phase-change cooler composing the cooling device 1000 according to the present exemplary embodiment is composed of the heat receiving unit 210 receiving the heat from a heating element and turning a refrigerant stored inside into a vapor state by the phase-change, and the heat radiating unit 220 drawing heat from the vapor-state refrigerant using a fan and the like placed outside and turning it into a liquid state by the phase-change. The heat receiving unit 210 is connected to the heat radiating unit 220 by two pipes, that is, the first pipe 231 and the second pipe 232. Since the phase-change cooler circulates a refrigerant using the action of gravity, the heat radiating unit 220 is configured to include a part located above the heat receiving unit 210 in the vertical direction.

As shown in FIG. 2A and FIG. 2B, the cooling device 1000 according to the present exemplary embodiment includes the above-mentioned phase-change cooler, the connecting board 110 having the opening in which the cooler is disposed, and the pressing plate 120. The pressing plate 120 is disposed so as to cover a surface opposite to the surface of the heat receiving unit 210 abutting against a heating element with the heat receiving unit 210 of the phase-change cooler disposed in the opening of the connecting board 110.

The connecting board 110 has enough thickness for a large deformation not to arise by the force which makes the heat receiving unit 210 abut firmly against the heating element and is generated due to the action of the first fixing unit 130. The opening of the connecting board 110 houses the heat receiving unit 210. The opening can be about the same size as a surface where the heat receiving unit 210 is connected to the heating element. It is desirable to be a size where the outline of the heat receiving unit 210 is extended by 0.05 mm to 0.2 mm, preferably. This configuration makes it possible to attach the heat receiving unit 210 to the heating element properly. That is to say, it is possible to avoid the situations that a gap of the arrangement position of the heat receiving unit 210 occurs in the in-plane direction of the contact surface and therefore the area of the surface decreases where the heat receiving unit 210 abuts firmly against the heating element.

The connecting board 110 includes a screw hole to fix the pressing plate 120 in the area peripheral to the opening, for example. The screw hole composes a part of the first fixing unit 130. The connecting board 110 has holes, into which fastening parts necessary for fastening it to the substrate or a chassis are inserted, near the outer periphery, for example, near four corners of the square shape. The holes compose a part of the second fixing unit 140. By means of the fastening member such as the holes and screws, the connecting board 110 on which the phase-change cooler is disposed is fastened to the substrate.

As shown in FIG. 2A and FIG. 2B, the heat radiating unit 220 of the above-mentioned phase-change cooler is disposed on the connecting board 110. This configuration makes it possible to distribute the force which is applied to the heat radiating unit 220 to the connecting board 110. Therefore, when the force is applied from the outside to the cooling device of the present exemplary embodiment, it becomes possible to reduce the force acting on a connection of the pipe where has low mechanical strength.

In contrast, in the related phase-change cooling device described in Patent Literature 1, although the evaporating unit (heat receiving unit) is fixed on the surface of the semiconductor device, the condenser (heat radiating unit) is not fixed on the chassis and is supported only by the pipe connecting the heat receiving unit to the heat radiating unit. Therefore, there has been a problem that the pipe is easy to damage and it is likely to affect the operations of the phase-change cooler if some impact is applied to the heat radiating unit from the outside. According to the cooling device 1000 of the present exemplary embodiment, however, such problem can be avoided as mentioned above.

In the related phase-change cooling device described in Patent Literature 1, there has been a problem that the cooling performance decreases because of an increase in the thermal resistance at the interface between the heat receiving unit and the heating element if the evaporating unit (heat receiving unit) is mounted on the surface of the semiconductor device. That is to say, in the related heat receiving unit described in Patent Literature 1, the center of gravity is located off-center due to its own weight of the heat radiating unit connected by the pipe. Therefore, the reason of the problem is because it is difficult to keep parallel the contact surface between the heat receiving unit and the heating element when the heat receiving unit is mounted on the surface of the semiconductor device.

According to the cooling device 1000 of the present exemplary embodiment, however, the heat radiating unit 220 is disposed on the connecting board 110 and the connecting board 110 supports the heat radiating unit 220, as mentioned above. This makes it possible to reduce the influence of its own weight of the heat radiating unit which the heat receiving unit 210 is subject to. According to the cooling device 1000 of the present exemplary embodiment, therefore, it is possible to avoid the problem that the cooling performance decreases because the contact surface between the heat receiving unit and the heating element tilts due to its own weight of the heat radiating unit.

As mentioned above, the pressing plate 120 is attached to the connecting board 110 and attached so as to cover the surface opposite to the contact surface between the heat receiving unit 210 and the heating element. The pressing plate 120 is preferably configured using a metal with a shape of thin plate, but it is not limited to this as long as it is a material elastically deformable.

By forming the pressing plate 120 using an elastic body with a shape of thin plate, it is possible to absorb minute irregularities occurring due to the production tolerance of the heat receiving unit 210 and the heating element when the heat receiving unit 210 is made to abut firmly against the heating element. It becomes, therefore, possible to press the heat receiving unit 210 equally against the contact surface of the heating element. At this time, the position of the heat receiving unit 210 can be shifted with absorbing minute irregularities. Even if this is the case, however, the operations of the cooling device 1000 are not affected because the pipe absorbs the shift. That is to say, since the pipe connecting the heat receiving unit 210 to the heat radiating unit 220 is configured to be deformable in response to bending, the deformation of the pipe makes it possible to absorb the position shift of the heat receiving unit 210. It is also acceptable that the pressing plate 120 is configured to include a cutout section where a portion of it is cut away to make the elastic deformation amount adjustable, by which the position shift of the heat receiving unit 210 is absorbed. Further, it is also possible to absorb the position shift of the heat receiving unit 210 by adjusting the position of the heat radiating unit 220 disposed on the connecting board 110. Specifically, for example, it is possible to incline a radiator composing the heat radiating unit 220 depending on the position variation of the heat receiving unit 210.

Next, the effect of the cooling device 1000 of the present exemplary embodiment will be further described.

According to the present exemplary embodiment, it becomes easier to perform a task of mounting the cooling device 1000 on the heating element disposed on the substrate. The reason is because it is possible to mount the heat receiving unit 210 on the heating element by fixing the connecting board 110 to the substrate or the chassis. The pressing plate 120, which has characteristics of spring to press the heat receiving unit 210, makes it possible to press the contact surface between the heating element and the heat receiving unit 210 by equal force. Even if the impact force is applied to the heat radiating unit 220 from the outside, the pipe becomes less damaged. If the impact is applied to the heat radiating unit 220 from the outside, part of the impact reaches to the connecting board 110 on which the heat radiating unit 220 is fixed and is transferred to the substrate or the chassis through the fastening member. This makes it possible to decrease the probability that the pipe is damaged.

According to the present exemplary embodiment, the degree of freedom of attaching the phase-change cooler increases and the versatility of using the phase-change cooler is expanded. The reason is as follows.

The connecting board 110 is fixed on the substrate or the chassis by means of the fastening member. As a result, even if the sizes of the fixing holes and the position between the fixing holes, which are formed in the substrate or the chassis, are modified, it is possible to respond to the modification only by changing the connecting board 110.

Further, according to the present exemplary embodiment, it is possible to simplify the process for mounting the phase-change cooler. The phase-change cooler needs to work on the condition that the refrigerant is encapsulated and sealed inside. It is therefore necessary to weld the pipe to the heat receiving unit and the heat radiating unit in advance by brazing technique and the like and to seal a refrigerant inlet after encapsulating the refrigerant. A swage, a weld, or a valve is generally used for the sealing process. However, since the configuration of the phase-change cooler is complicated, there is the potential for significant difficulty in the process for mounting the phase-change cooler. That is to say, trying to make a hole to fix the heat receiving unit or the heat radiating unit on the substrate after the process for sealing, there is the potential for the situation that tools cannot be placed at the position desired. According to the present exemplary embodiment, however, it is possible to attach the heat receiving unit 210 composing the phase-change cooler only by the process for arranging it in the opening 111 of the connecting board 110 and pressing it by the pressing plate 120. This makes it possible to mount the phase-change cooler easily.

[The Third Exemplary Embodiment]

Figure 3B:
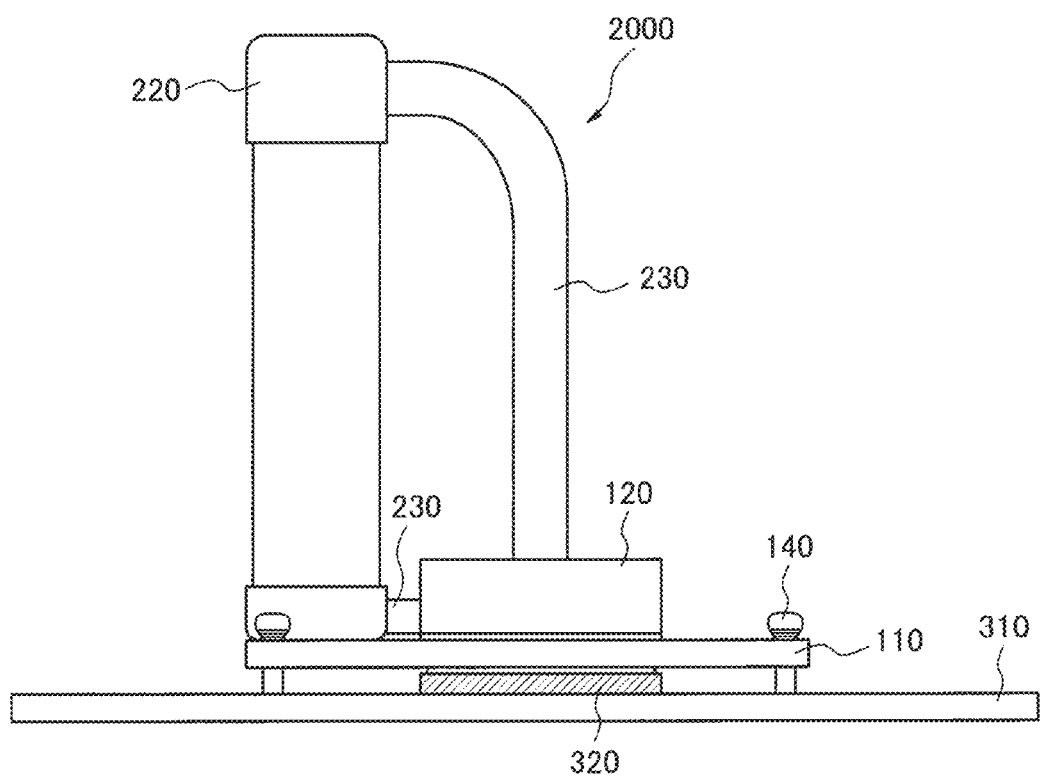
FIG. 3B is a side view illustrating the configuration of the electronic device using the cooling device in accordance with the third exemplary embodiment of the present invention.

Next, the third exemplary embodiment of the present invention will be described. FIG. 3A and FIG. 3B are diagrams illustrating a configuration of an electronic device using a cooling device 2000 in accordance with the third exemplary embodiment of the present invention, FIG. 3A is a perspective view, and FIG. 3B is a side view. The electronic device using a cooling device 2000 includes a substrate 310, a heating element 320 mounted on the substrate 310, the heat receiving unit 210, heat radiating unit 220, and the pipe 230 connecting the heat receiving unit 210 to the heat radiating unit 220. The heat receiving unit 210 stores a refrigerant and receives the heat from the heating element 320. The heat radiating unit 220 condenses and liquefies the vapor-state refrigerant vaporized in the heat receiving unit 210 and radiates heat.

The electronic device using the cooling device 2000 further includes the connecting board 110 with the opening 111, the pressing plate 120 of thin plate elastically deformable, the first fixing unit 130, and the second fixing unit 140. The first fixing unit 130 fixes the pressing plate 120 to the connecting board 110 with the pressing plate 120 disposed covering the heat receiving unit 210. At this time, the first fixing unit 130 fixes the pressing plate 120 to the connecting board 110 with the heat receiving unit 210 abutting firmly against the heating element 320. The second fixing unit 140 fixes the connecting board 110 to the substrate 310 with the heating element 320 and the heat receiving unit 210 disposed in the opening 111. At this time, the second fixing unit 140 fixes the connecting board 110 to the substrate 310 with the heat receiving unit 210 abutting firmly against the heating element 320.

The electronic device using the cooling device 2000 according to the present exemplary embodiment is configured to include a phase-change cooler in which the heat receiving unit 210 is connected to the heat radiating unit 220 by the pipe 230. As shown in FIG. 3A and FIG. 3B, in the electronic device using the cooling device 2000 of the present exemplary embodiment, the phase-change cooler fixed on the connecting board 110 is implemented on the heating element 320 mounted on the substrate 310. An electronic circuit board mounting electronic components such as CPUs, for example, a mother board can be used as the substrate 310.

Figure 4:
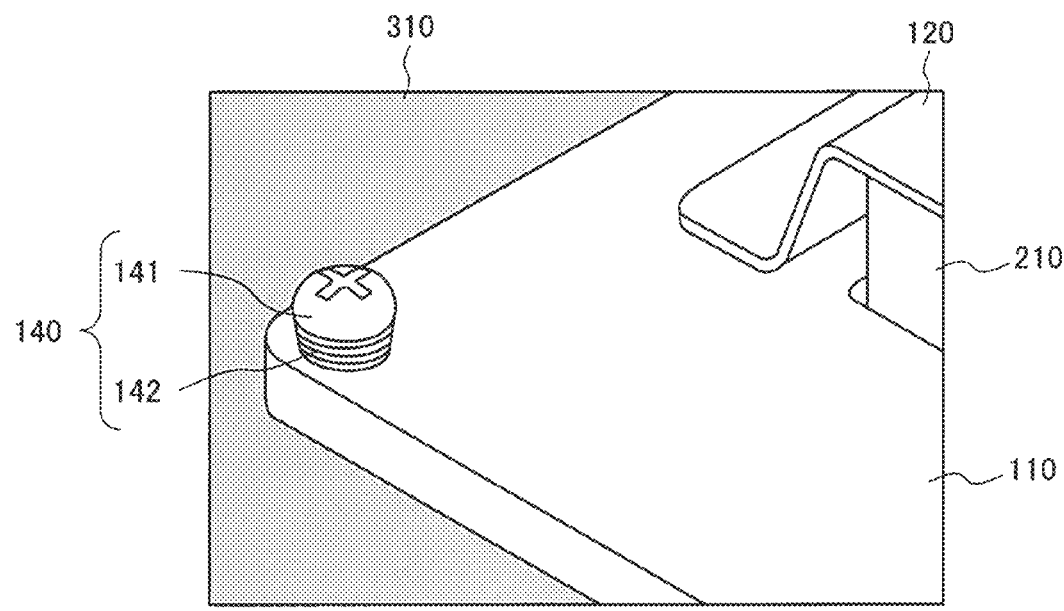
FIG. 4 is a perspective view illustrating a part of another configuration of the electronic device using the cooling device in accordance with the third exemplary embodiment of the present invention.

The phase-change cooler is fixed to the heating element 320 through the connecting board 110 and the second fixing unit 140. Specifically, for example, the second fixing unit 140 is configured to include holes formed in the connecting board 110 and a fastening section loaded into the holes. At this time, as shown in FIG. 4, the second fixing unit 140 can be configured to include a fastening section 141 such as a screw and a spring section 142. By using a spring, it becomes easier to control the pressure by which to press the heating element 320 and the heat receiving unit 210 and to make them attached firmly to each other. It becomes possible by the action of the pressing plate 120 in addition to the above to absorb the effect of the concavo-convex shape due to the production tolerance of the heat receiving unit 210 and the heating element 320 and to press the contact surface between the heating element 320 and the heat receiving unit 210 by more equal force.

Figure 5:
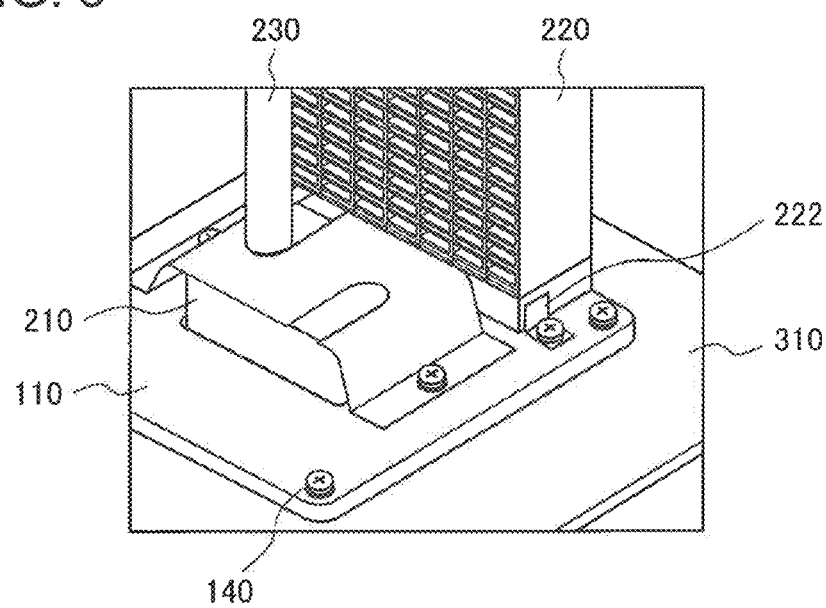
FIG. 5 is a perspective view illustrating a part of yet another configuration of the electronic device using the cooling device in accordance with the third exemplary embodiment of the present invention.

As shown in FIG. 5, when the heat radiating unit 220 is disposed on the connecting board 110, it is also acceptable to attach an L-shaped fixed plate 222 to the heat radiating unit 220 and fix it to the connecting board 110 by the fastening member. In this case, it is preferable to form the fixed plate 222 using a thin metal plate elastically deformable. The reason is as follows. In order for the equal force to act at the contact surface when the heat receiving unit 210 is pressed toward the heating element by means of the pressing plate 120, the pressing plate 120 need to deform to absorb the variation in shape of the heat receiving unit 210. The reason is because the heat radiating unit 220 connected to the heat receiving unit 210 through the pipe 230 needs to have range of motion.

As mentioned above, according to the electronic device using the cooling device 2000 of the present exemplary embodiment, it is possible to decrease the thermal resistance at the interface between the heat receiving unit and the heating element because they are fixed firmly with the whole contact surface between the heating element and the heat receiving unit pressed by equal force. That is to say, even though the cooling device using the phase-change system is used in which the heat receiving unit is connected to the heat radiating unit by the pipe, it is possible to obtain the electronic device having sufficient cooling performance.

The present invention is not limited to the aforementioned exemplary embodiments. Various modifications can be made therein within the scope of the present invention as defined by the claims, and obviously, such modifications are included in the scope of the present invention.

This application is based upon and claims the benefit of priority from Japanese Patent Application No. 2012-112498, filed on May 16, 2012, the disclosure of which is incorporated herein in its entirety by reference.

REFERENCE SIGNS LIST 100 connecting structure of a cooling device
110 connecting board
111 opening
120 pressing plate
130 first fixing unit
140 second fixing unit
141 fastening section
142 spring section
210 heat receiving unit
220 heat radiating unit
222 fixed plate
230 pipe
231 first pipe
232 second pipe
310 substrate
320 heating element
1000 cooling device
2000 electronic using cooling device

The invention claimed is:

1. A cooling device, comprising:
a heat receiving unit for storing a refrigerant and receiving the heat from a heating element;
a connecting board with an opening;
a pressing plate of thin plate elastically deformable;
a first fixing unit for fixing the pressing plate to the connecting board with the pressing plate disposed covering the heat receiving unit; and
a second fixing unit for fixing the connecting board to a substrate with the heat receiving unit abutting against a heating element mounted on the substrate and disposed in the opening.

2. The cooling device according to claim 1, further comprising a heat radiating unit for radiating heat by condensing and liquefying a vapor-state refrigerant vaporized in the heat receiving unit; and
a pipe connecting the heat radiating unit to the heat receiving unit,
wherein the heat radiating unit is disposed on the connecting board.

3. The cooling device according to claim 1,
wherein the pipe comprises a first pipe connecting an upper part of the heat receiving unit to an upper part of the heat radiating unit, and a second pipe connecting a side surface of the heat receiving unit to a lower part of the heat radiating unit.

4. The cooling device according to claim 1,
wherein the pressing plate comprises a cutout section where a portion of the pressing plate is cut away.

5. The cooling device according to claim 1,
wherein the second fixing unit comprises a fastening section and a spring section.

6. An electronic device using a cooling device, comprising:
a substrate;
a heating element mounted on the substrate;
a heat receiving unit for storing a refrigerant and receiving the heat from the heating element;
a connecting board with an opening;
a pressing plate of thin plate elastically deformable;
a first fixing unit for fixing the pressing plate to the connecting board with the pressing plate disposed covering the heat receiving unit;
a second fixing unit for fixing the connecting board to the substrate with the heating element and the heat receiving unit disposed in the opening;
a heat radiating unit for radiating heat by condensing and liquefying a vapor-state refrigerant vaporized in the heat receiving unit; and
a pipe connecting the heat radiating unit to the heat receiving unit,
wherein the first fixing unit fixes the pressing plate to the connecting board with the heat receiving unit abutting firmly against the heating element, and
the second fixing unit fixes the connecting board to the substrate with the heat receiving unit abutting firmly against the heating element.

7. A method for connecting a cooling device, comprising:
forming a connecting board with an opening;
disposing a heat receiving unit that composing a cooling device in the opening;
disposing a pressing plate of thin plate elastically deformable so as to cover the heat receiving unit;
connecting the pressing plate to the connecting board;
disposing the connecting board on a substrate on which a heating element is mounted so that the heating element may be housed in the opening;
disposing, on the connecting board, a heat radiating unit radiating heat by condensing and liquefying a vapor-state refrigerant vaporized in the heat receiving unit; and
connecting the heat radiating unit to the heat receiving unit by a pipe.

8. The cooling device according to claim 2,
wherein the pipe comprises a first pipe connecting an upper part of the heat receiving unit to an upper part of the heat radiating unit, and a second pipe connecting a side surface of the heat receiving unit to a lower part of the heat radiating unit.

9. The cooling device according to claim 2,
wherein the pressing plate comprises a cutout section where a portion of the pressing plate is cut away.

10. The cooling device according to claim 3,
wherein the pressing plate comprises a cutout section where a portion of the pressing plate is cut away.

11. The cooling device according to claim 2,
wherein the second fixing unit comprises a fastening section and a spring section.

12. The cooling device according to claim 3,
wherein the second fixing unit comprises a fastening section and a spring section.

13. The cooling device according to claim 4,
wherein the second fixing unit comprises a fastening section and a spring section.

14. The method for connecting a cooling device according to claim 7, further comprising:
fixing the pressing plate to the connecting board and fixing the connecting board to the substrate, with the heat receiving unit made to abut firmly against the heating element.

* * * * *